(12) United States Patent
Okumura

(10) Patent No.: US 7,649,734 B2
(45) Date of Patent: Jan. 19, 2010

(54) PORTABLE STORAGE DEVICE

(75) Inventor: Naohisa Okumura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 11/719,368

(22) PCT Filed: Sep. 25, 2006

(86) PCT No.: PCT/JP2006/319614

§ 371 (c)(1),
(2), (4) Date: Feb. 8, 2008

(87) PCT Pub. No.: WO2007/035001

PCT Pub. Date: Mar. 29, 2007

(65) Prior Publication Data

US 2009/0141440 A1    Jun. 4, 2009

(30) Foreign Application Priority Data

Sep. 26, 2005    (JP)    ............................. 2005-277496

(51) Int. Cl.
*H05K 5/00*    (2006.01)
(52) U.S. Cl. .................. 361/679.33; 361/752; 365/205; 455/556.1; 439/680
(58) Field of Classification Search ............ 365/185.17, 365/205, 202, 227, 189.07; 455/566, 566.1, 455/558, 90.2; 345/161; 439/76.1, 680, 439/326; 361/679.31, 679.32, 679.21, 679.46
See application file for complete search history.

(56) References Cited

U.S. PATENT DOCUMENTS

2004/0153595 A1    8/2004    Sukegawa et al.
2006/0285305 A1*   12/2006    Okumura .................... 361/752
2007/0066102 A1     3/2007    Takemoto et al.
2008/0247249 A1*   10/2008    Lee ............................ 365/205
2009/0052886 A1*    2/2009    Watanabe et al. ........... 396/486

FOREIGN PATENT DOCUMENTS

| JP | 3086525 | 3/2002 |
| JP | 2005 18731 | 1/2005 |
| JP | 2005 25384 | 1/2005 |

* cited by examiner

*Primary Examiner*—Hung V Duong
(74) *Attorney, Agent, or Firm*—Oblon, Spivak, McClelland, Maier & Neustadt, L.L.P.

(57) ABSTRACT

A portable storage device which is used by being connected to terminals of an external apparatus, comprises a main body of a rectangular cover case, in which an opening is formed at a front and a fit opening is formed in a wall; a rectangular terminal enclosure supported inside said main body of the cover case, and having a terminal portion at a front for connection with the external terminals, and having a fit portion which is formed in a wall so as to be opposed to said fit opening when inserted into said main body of the cover case; a circuit board which is supported in said terminal enclosure and provided with connector terminals at a front; a semiconductor memory device which is mounted on said circuit board, sealed with resin and connected to said connector terminals; and a fitting member which is inserted into said fit opening of said main body of the cover case so as to be fitted to said fit opening, and to be fitted to said fit portion of said terminal enclosure to thereby fix said main body of the cover case and said terminal enclosure.

15 Claims, 7 Drawing Sheets

PORTABLE STORAGE DEVICE

CROSS-REFERENCE TO RELATED APPLICATION S

This application is based upon and claims the benefit of priority from the prior Japanese Patent Application No. 2005-277496, filed on Sep. 26, 2005, the entire contents of which are incorporated herein by reference.

BACKGROUND OF THE INVENTION

1. Field of the Invention

The present invention relates to a portable storage device provided with a terminal enclosure for accommodating a circuit board on which a semiconductor memory device is mounted, and provided with a cover case main body for protecting the terminal enclosure.

2. Background Art

Conventional cover cases for portable storage devices have been used not only for the purpose of protecting electronic parts mounted on a circuit board, but also for providing excellent safety and usability.

One of the conventional portable storage devices is provided with a substrate to which a USB connector head is connected, a lower cover for protecting the substrate from the side of an under surface of the substrate, an upper cover for protecting the substrate from the side of a top surface of the substrate, and a case cover for accommodating the USB connector head. The substrate is sandwiched between the upper cover and the lower cover for accommodation, and these covers are fixed by means of bolts (For example, refer to Japanese Utility Model Publication No. 3086524).

However, the above conventional art, which requires at least two or more parts, as mentioned above, on a front side and a back side, invites complexity in a technique for attaching a substrate to a protection case (the upper cover and the lower cover).

One of the conventional portable storage devices is provided with a substrate having USB terminals at its front, a terminal enclosure for inserting therein the substrate from a front opening to support the substrate, and an end cap (cover case) which is connected to a rear of the terminal enclosure to serve as a handhold at the time the portable storage device is carried or loaded on an external apparatus (see, for example, U.S. Patent Application No. 2004/0153595).

In the above conventional art, however, merely inserting the terminal enclosure into the end cap can only provide poor adhesiveness therebetween, resulting in that the terminal enclosure easily comes off from the end cap. Under such circumstances, it has been required to coat a liquid adhesive material inside the end cap or stick a sheet-like adhesive material thereto, then insert the terminal enclosure, and perform drying to increase adhesiveness.

In use of liquid adhesive materials, many factors should be controlled for coating conditions (amount of coating, position of coating, etc.) and curing conditions of the liquid adhesive materials. This causes technical difficulty in achieving fixation between the end cap and the terminal enclosure, which leads to complicated processes and expensive equipment for the processes.

In use of sheet-like adhesive materials, many factors should also be controlled for sheet sizes, sticking conditions (pressure, temperature, time, etc.), and curing conditions of the sheet-like adhesive materials, also causing technical difficulty in achieving fixation between the end cap and the terminal enclosure.

As described above, according to conventional art, there has been a problem that assembling time and manufacturing costs of portable storage devices cannot be reduced.

SUMMARY OF THE INVENTION

According one aspect of the present invention, there is provided: a portable storage device which is used by being connected to terminals of an external apparatus, comprising a main body of a rectangular cover case, in which an opening is formed at a front and a fit opening is formed in a wall; a rectangular terminal enclosure supported inside said main body of the cover case, and having a terminal portion at a front for connection with the external terminals, and having a fit portion which is formed in a wall so as to be opposed to said fit opening when inserted into said main body of the cover case; a circuit board which is supported in said terminal enclosure arid provided with connector terminals at a front; a semiconductor memory device which is mounted on said circuit board, sealed with resin and connected to said connector terminals; arid a fitting member which is inserted into said fit opening of said main body of the cover case so as to be fitted to said fit opening, and to be fitted to said fit portion of said terminal enclosure to thereby fix said main body of the cover case and said terminal enclosure.

DETAILED DESCRIPTION

With reference to the accompanying drawings, hereinafter are described embodiments of the present invention. In particular, in the following embodiments, description is provided on a USB memory which is used as a portable storage device being connected to the terminals of an external apparatus.

First Embodiment

Figure 1:
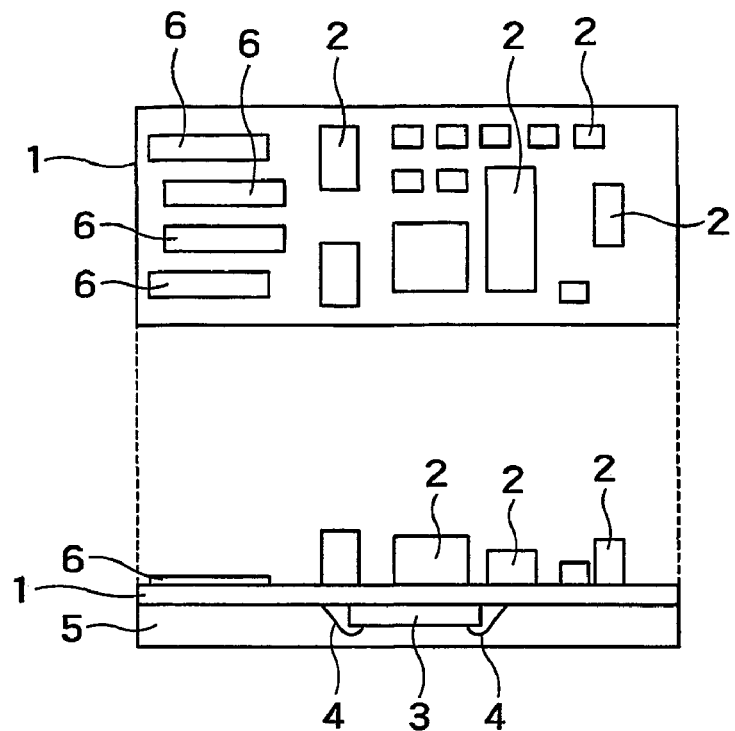
FIG. 1 is a schematic diagram showing a top view and a side view of a circuit board of a portable storage device according to a first embodiment of the present invention.

FIG. 1 is a schematic diagram showing a top view and a side view of a circuit board of a portable storage device according to a first embodiment of the present invention.

As shown in FIG. 1, a rectangular circuit board 1 having a substrate such as of silicon is provided thereon with electronic parts 2 including a capacitor, a resistor, a regulator and light emitting devices (LEDs). It should be appreciated that the electronic parts 2 in a sealed state may be mounted on the circuit board 1, or the electronic parts 2 may be provided on the circuit board 1 first and then molded on the substrate.

A semiconductor memory device 3 is mounted on an under surface of the circuit board 1. The semiconductor memory device 3 includes semiconductor memories, such as NAND memory chips, and controllers, and is adapted to store and output desired data. The semiconductor memory device 3 is sealed with a sealing resin 5 after being connected to pads formed on the circuit board 1 through bonding wires 4, for example.

Connector terminals 6, which are made of metal or the like and electrically connected to the electronic parts 2 and the semiconductor memory device 3, are provided at a front of the circuit board 1. By connecting the connector terminals 6 with the terminals (not shown) of an external apparatus, the semiconductor memory device 3 and the external apparatus are enabled to receive/transmit data therebetween.

Figure 2:
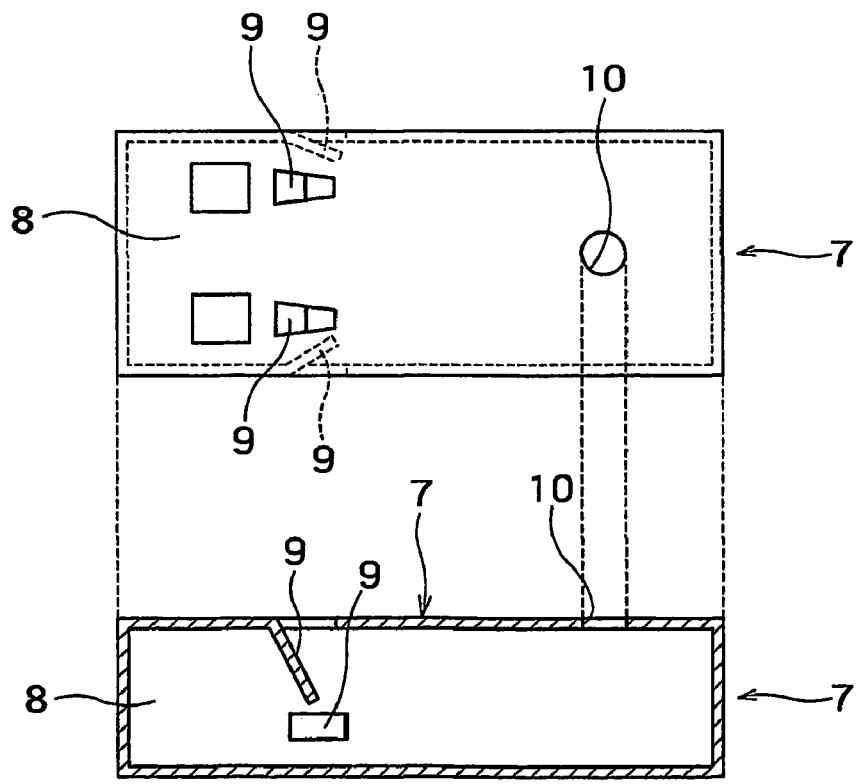
FIG. 2 illustrates a top view and a side view of a terminal enclosure of the portable storage device according to the first embodiment of the present invention.
Figure 3:
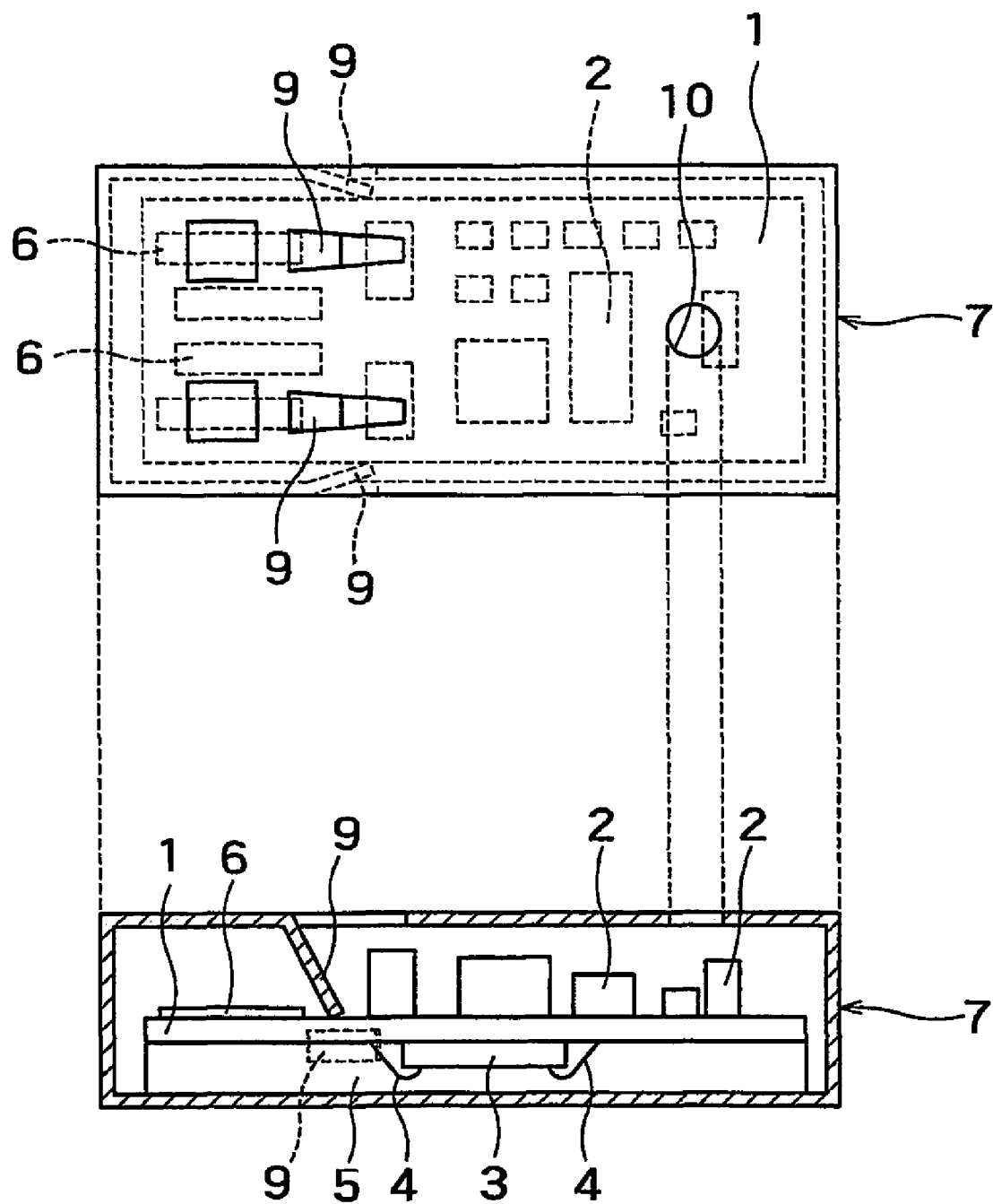
FIG. 3 illustrates a state where the circuit board 1 shown in FIG. 1 is inserted into the terminal exposure shown in FIG. 2 and supported inside.

FIG. 2 illustrates a top view and a side view of a terminal enclosure of the portable storage device according to the first embodiment of the present invention. FIG. 3 illustrates a state where the circuit board 1 shown in FIG. 1 is inserted into the terminal enclosure shown in FIG. 2 and supported inside.

As shown in FIG. 2, a rectangular terminal enclosure 7 having a member such as of metal, has a terminal portion 8 at a front thereof, which constitutes USB terminals to be connected to the external terminals mentioned above, and support portions 9 for supporting the circuit board 1 inserted therein with elastic force, and a circular fit portion 10 which is formed in the top surface.

Each of the support portions 9 is formed by making a cut in a side wall and a top wall of the terminal enclosure 7 so that each wall has a U-shaped cut which is open rearward, and by tilting inward a portion having the U-shaped cut in each of the walls of the terminal enclosure 7 so as to be projected inward. It should be appreciated that the support portion 9 provided at the top wall is tilted inward after the insertion of the circuit board 1.

The fit portion 10 may be formed through the top wall of the terminal enclosure 7, or may have a shape of a recess which is formed in the top surface of the top wall.

As shown in FIG. 3, the circuit board 1 is supported in the terminal enclosure 7 so that the portion provided with the connector terminals 6 is located at the front. As mentioned above, the circuit board 1 is supported by elastic force, being in contact with the support portions 9. A height from a bottom wall to a top surface of each of the connector terminals 6 in the terminal enclosure 7 is ensured to be in conformity with the standard of e.g. USB terminals. In the present embodiment, a thickness of the sealing resin 5, which is in contact with the bottom wall, is set at a predetermined thickness to adjust the height of each of the connector terminals 6.

Figure 4:
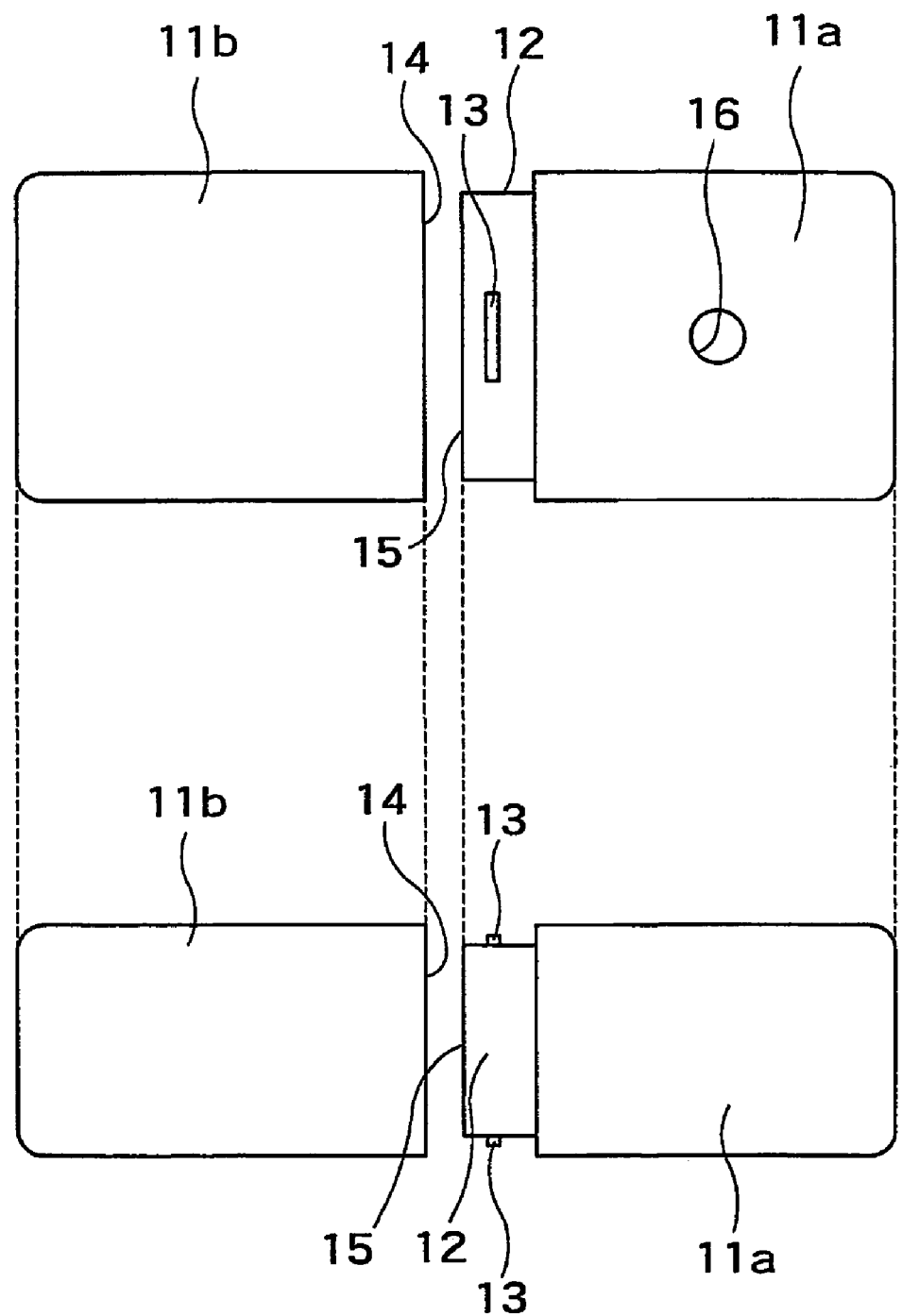
FIG. 4 illustrates a top view and a side view of a cover case of the portable storage device according to the first embodiment of the present invention.

FIG. 4 illustrates a top view and a side view of a cover case of the portable storage device according to the first embodiment of the present invention.

As shown in FIG. 4, a rectangular cover case 11 includes a main body 11a for accommodating and supporting therein the terminal enclosure 7 shown in FIG. 3, and a cap lib for covering a terminal portion of the terminal enclosure 7 by being coupled to the main body 11a. The main body 11a and the cap 11b are formed by integral molding using plastic or metal material, for example.

An engagement portion 13 is formed at a connecting portion 12 of the main body 11a. The connecting portion 12 can be inserted into an opening 14 of the cap 11b to have the engagement portion 13 engaged with a portion to be engaged, not shown, thereby coupling the main body 11a with the cap 11b.

An opening 15 is formed at a front of the main body 11a. This opening 15 is provided so that the terminal enclosure 7 can be inserted from its rear and the terminal portion 8 can be exposed at the front when assembling the portable storage device.

A circular fit opening 16 is formed through a top wall of the main body 11a. The fit opening 16 is adapted to be opposed to the fit portion 10 of the terminal enclosure 7 in a state where the terminal enclosure 7 is inserted into the main body 11a.

Figure 5A:
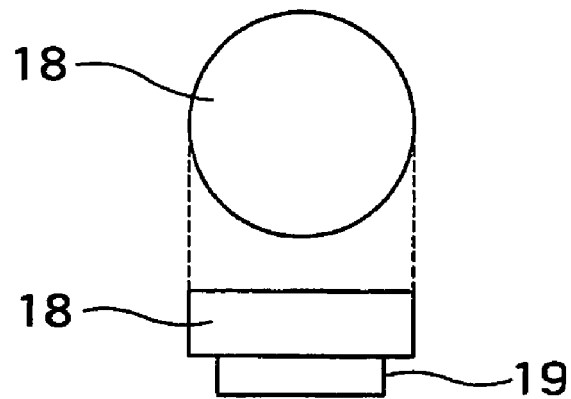
FIG. 5A illustrates a top view and a side view of a fitting member of the portable storage device according to the first embodiment of the present invention.
Figure 5B:
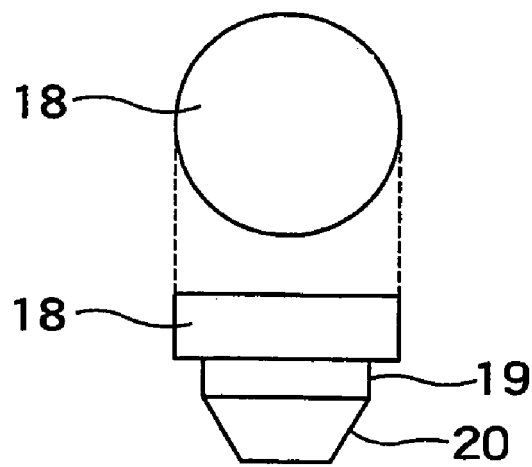
FIG. 5B illustrates a top view and a side view of another fitting member of the portable storage device according to the first embodiment of the present invention.

FIG. 5A illustrates a top view and a side view of a fitting member of the portable storage device according to the first embodiment of the present invention. FIG. 5B illustrates a top view and a side view of another fitting member of the portable storage device according to the first embodiment of the present invention.

As shown in FIG. 5A, a fitting member 17a is provided with a barrel cap portion 18 fitted to the fit opening 16 of the cover case 11, and a cylindrical barrel portion 19 having a smaller diameter than the cap portion 18 and fitted to the fit portion 10 of the terminal enclosure 7. Preferably, a diameter of the cap portion 18 may be larger than an inner diameter of the fit opening 16. Preferably, a diameter of the barrel portion 19 may be smaller than the inner diameter of the fit opening 16 but larger than an inner diameter of the fit portion 10 in order to be fitted to the fit portion 10. The cap portion 18 and the barrel portion 19 may each have a rectangular shape that can be fitted to the fit opening 16 and the fit portion 10, respectively.

The fitting member 17a is formed, for example, of a material (resin) having transparent color, and a material (resin) which can transmit output light emitted from light emitting devices, such as LEDs, provided on a circuit board. Thus, when the LEDs provided on the circuit board 1 emit light in response to the power supply from an external apparatus, the output light of the LEDs transmits through the fitting member 17a, so that a user may be notified of the fact the USB memory is in operation. In this way, there is no necessity of separately providing a window in the cover case 11 for externally outputting the output light of the LEDs provided on the circuit board 1, thereby reducing the number of parts of the USB memory.

In order to attain alignment with the fit opening 16 of the cover case 11, a fitting member 17b has a tapered projection 20 at an end portion (barrel portion 19) to be inserted into the fit opening 16, as shown in FIG. 5B. Since the projection 20 is formed to have a tapered shape, even when a center of axis of the fit opening 16 is misaligned with that of the fitting member 17b at the time of inserting the fitting member 17b into the fit opening 16, it is so arranged that insertion of the fitting member 17b can be carried out, with a sliding movement for alignment of both of the center axes to finally achieve fitting at a predetermined position.

Figure 7:
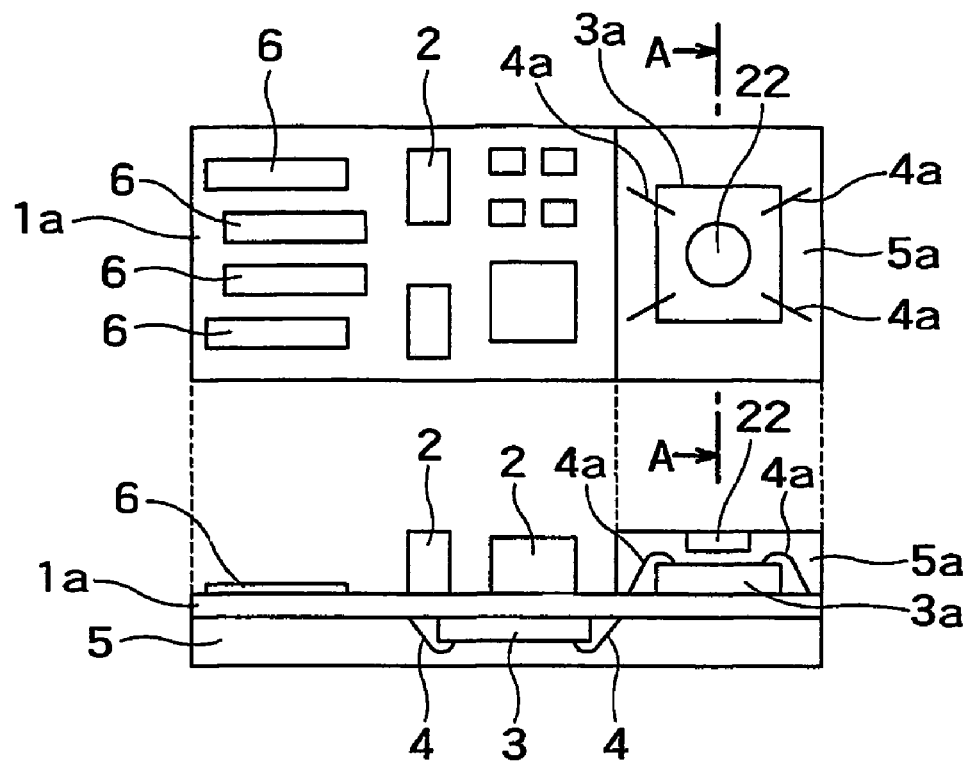
FIG. 7 illustrates a top view and a side view of a circuit board of a portable storage device according to a second embodiment of the present invention.

As shown in FIG. 7, when the fitting member 17b is used as mentioned above, the fit portion 10 may serve as a through hole passing through the terminal enclosure 7, and thus the projection 20 may be ensured to be inserted through this through hole.

Figure 6:
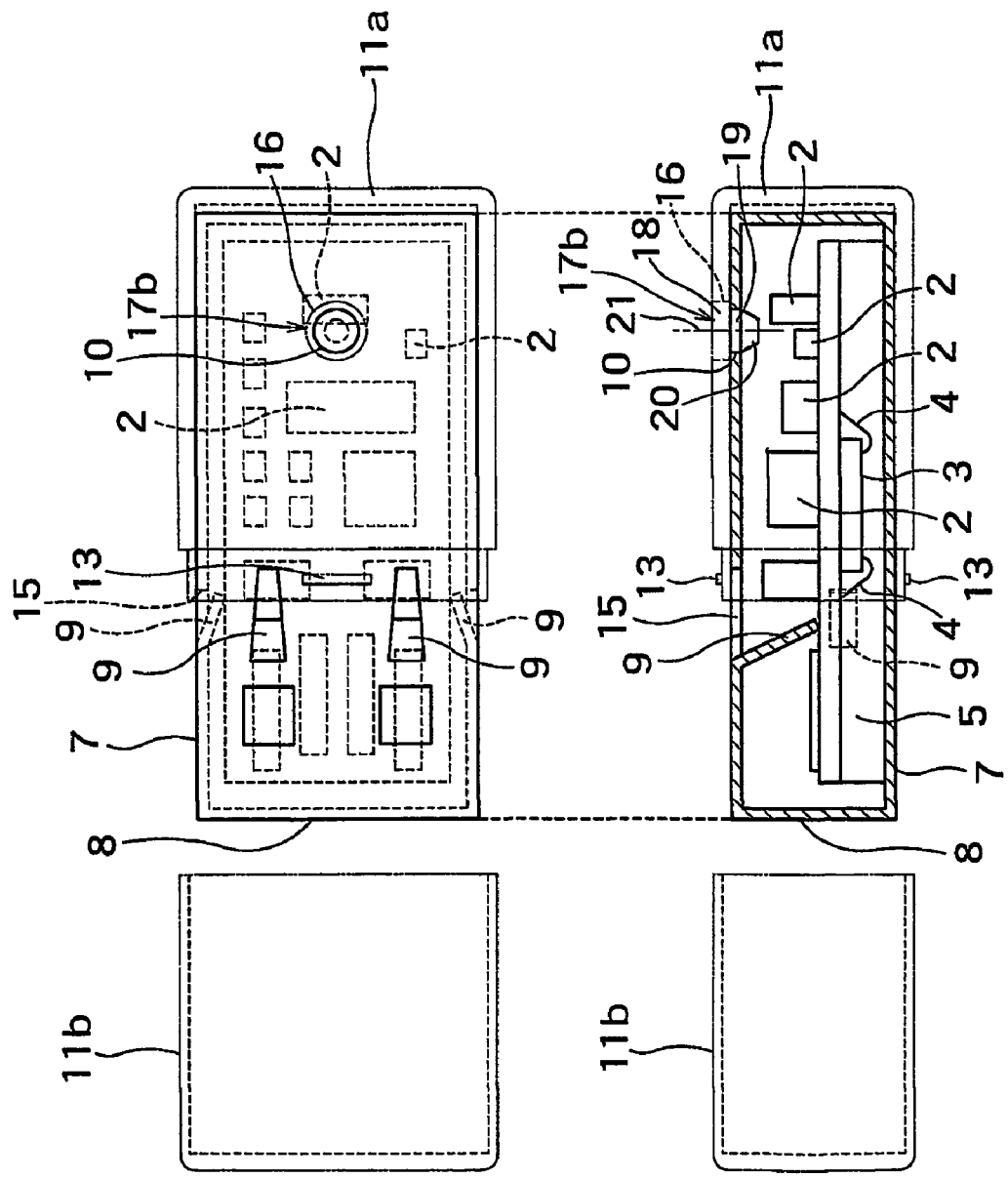
FIG. 6 illustrates a top view and a side view of the portable storage device according to the first embodiment of the present invention.

The entire arrangement of the portable storage device having the above components will now be described hereunder. FIG. 6 illustrates a top view and a side view of the portable storage device according to the first embodiment of the present invention. The fitting member 17b shown in FIG. 5B is used here as a fitting member.

As shown in FIG. 6, in a portable storage device 100, the terminal enclosure 7 accommodating the circuit board 1 is supported by inserting it into the main body 11a of the cover case 11 from the opening 15, with the terminal enclosure 7 and the cover case 11 being fixed by the fitting member 17b.

As described above, under the condition where the terminal enclosure 7 and the cover case 11 do not transmit the output light from the light emitting devices (electronic parts 2) provided on the circuit board 1, the transmitted light of the light emitting devices, which has passed through the fitting member 17b, is ensured to be seen from outside.

In assembling the portable storage device 100, a back side of the circuit board 1 on which the semiconductor memory device 3, the electronic parts 2 and the like are mounted is inserted, first, into the terminal enclosure 7 through the opening at the terminal portion 8 until a predetermined position is reached. The circuit board 1 is then elastically supported by the support portions 9 provided at left and right sides, and also by the upper support portion, which has been integrally positioned at the upper wall before insertion of the circuit board 1, being bent after the insertion to contact the circuit board 1, for example.

Subsequently, a back side of the terminal enclosure 7 accommodating the circuit board 1 is inserted into the main body 11a of the cover case 11 through the opening 15 until a predetermined position is reached. In this way, the terminal enclosure 7 is accommodated in the main body 11a with the terminal portion 8 being exposed. At this moment, the fit opening 16 and the fitting member 17b of the fit portion 10 are aligned with each other on a center of axis 21.

The fitting member 17b is then fitted to the fit opening 16 and the fit portion 10 to fix the terminal enclosure 7 and the main body 11a of the cove case 11. The assembling is completed when the cap 11b for covering the terminal portion 8 is coupled to the main body 11a.

Thus, the portable storage device 100 can be readily assembled by fixing the terminal enclosure 7 and the main body 11a without the necessity of providing a step of coating a liquid adhesive material on the inside of the main body 11a of the cover case 11 or a step of sticking the sheet-like adhesive material onto the terminal enclosure 7, which materials would otherwise have caused difficulty in controlling the process.

As described above, according to the portable storage device of the present embodiment, use of the fitting member for fixture of the terminal enclosure for accommodating the circuit board on which the semiconductor memory device is mounted, and the cover case protecting the terminal enclosure, can facilitate the assembling of the portable storage device and thus can reduce the assembling time and manufacturing costs.

Second Embodiment

In the first embodiment, description has been provided on an arrangement in which the semiconductor memory device is provided on the under surface of the circuit board and sealed with resin. In the present embodiment is described an arrangement in which another semiconductor memory device is provided on a top surface of a circuit board and sealed with resin.

Figure 8:
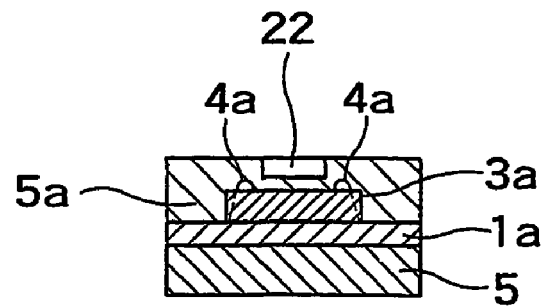
FIG. 8 is a cross section of view of the circuit board taken along an A-A line in FIG. 7.

FIG. 7 illustrates a top view and a side view of a circuit board of a portable storage device according to a second embodiment of the present invention. FIG. 8 is a cross section of the circuit board taken along an A-A line in FIG. 7. In the figures, the same reference numerals as fn the first embodiment indicate the similar components as in the first embodiment 1.

As shown in FIG. 7, another semiconductor memory device 3a is provided on a rear potion of the top surface of a circuit board 1a, connected to pads (not shown) formed on the circuit board 1a through bonding wires 4a, and sealed with a sealing resin 5a.

A height of the sealing resin 5a from the top surface of the circuit board 1a is adjusted so that, for example, the sealing resin 5a is in contact with the inner surface of a top wall of the terminal enclosure. Thus, looseness that would have been made, after insertion into main body 11a of the cover case 11, can be eliminated to enhance the precision of assembling. In case the sealing resin 5a and the fitting member 17b are in contact with each other, a recess 22 may be formed in the sealing resin 5a as shown in FIGS. 7 and 8 to allow the projection 20 of the fitting member 17b shown in FIG. 5B to be inserted into the recess 22 for avoiding contact.

As described above, according to the portable storage device of the present embodiment, use of the fitting member for fixture of the terminal enclosure for accommodating the circuit board on which the semiconductor memory device is mounted, and the cover case protecting the terminal enclosure, can facilitate the assembling of the portable storage device and thus can reduce the assembling time and manufacturing costs.

Third Embodiment

In each of the first and second embodiments, description has been provided on an arrangement in which the semiconductor memory device is provided on the under surface of the circuit board and sealed with the sealing resin. In the present embodiment is described an arrangement in which no semiconductor memory device is provided on the under surface of the circuit board.

Figure 9:
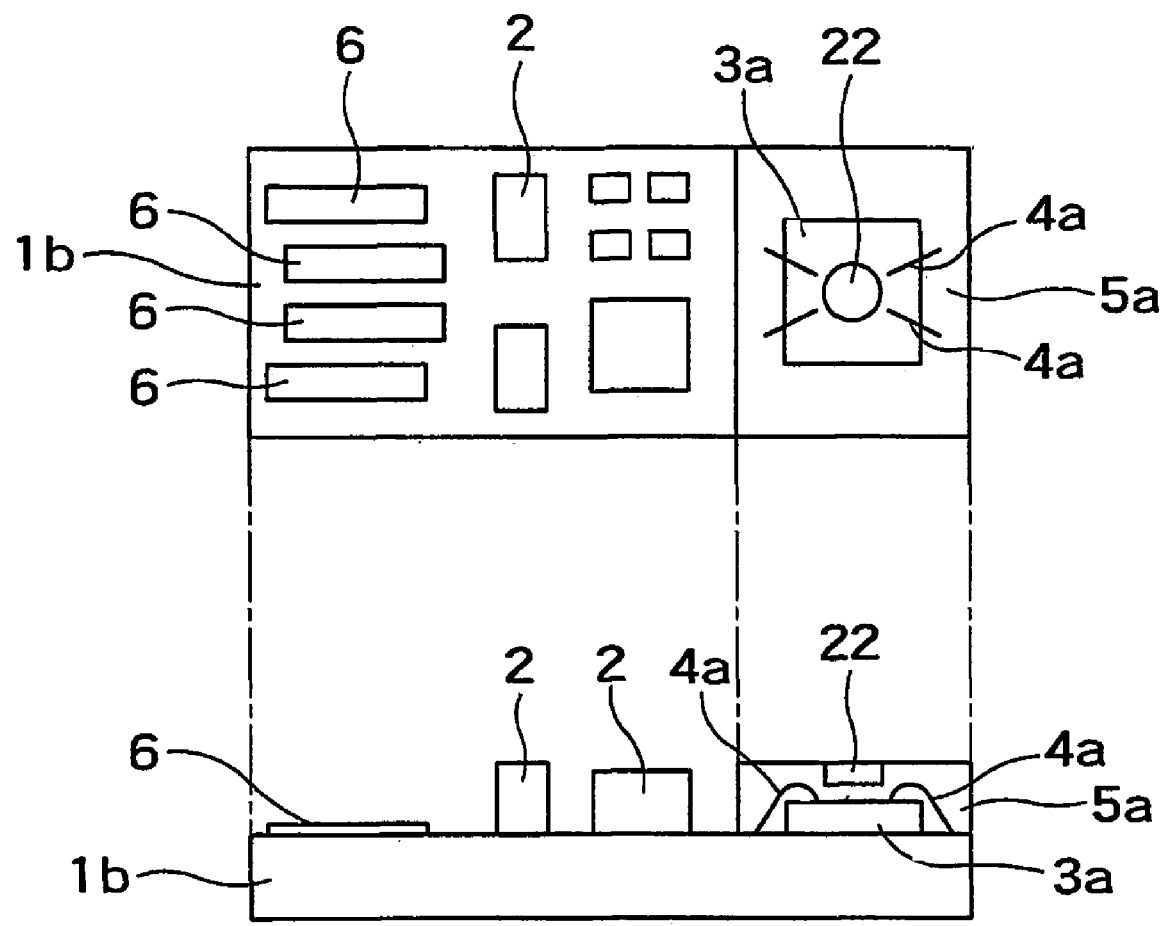
FIG. 9 illustrates a top view and a side view of a portable storage device according to a third embodiment of the present invention.

FIG. 9 illustrates a top view and a side view of a portable storage device according to a third embodiment of the present invention. In the figure, the same reference numerals as in the first and second embodiments indicate the similar components as in the first and second embodiments.

As shown in FIG. 9, the electronic parts 2 are mounted on a top surface of a circuit board 1b, and also, a semiconductor memory device 3a is mounted on the top surface and sealed with the sealing resin 5a.

A height of the circuit board 1b from the bottom wall in the terminal enclosure 7, i.e. the bottom wall with which an under surface of the circuit board 1b is in contact, to a top surface of each of the connector terminals 6, for example, is predetermined so as to be in conformity with the standard of USB terminals.

As described above, according to the portable storage device of the present embodiment, use of the fitting member for fixture of the terminal enclosure for accommodating the circuit board on which the semiconductor memory device is mounted, and the cover case protecting the terminal enclosure, can facilitate the assembling of the portable storage device and thus can reduce the assembling time and manufacturing costs.

Although in each of the above embodiments, the electronic parts have been provided on the top surface of the circuit board, it should be appreciated that the present invention can be applied to an embodiment in which the electronic parts are provided on the under surface or both surfaces of the circuit board.

In each of the above embodiments, the terminal enclosure and the cover case have been obtained by integral molding. However, if the terminal enclosure and the cover case are formed by using a plurality of parts, at least the terminal enclosure and the cover case can be readily fixed.

In each of the above embodiments, the fitting member is adapted to be fitted to the fit opening and the fit portion. Alternately, however, the fitting member may have a shape of a screw which can be threadably fitted to the fit opening and the fit portion.

In each of the above embodiments, a single fitting member has been used for fixing the cover case and the terminal enclosure, however, a plurality of fitting bodies may be used for fixture at a plurality of positions.

In each of the above embodiments, the cover case has been made up of the main body and the cap, however, the cover case may have only the main body, which can still bring about the same effect.

The invention claimed is:

1. A portable storage device which is used by being connected to terminals of an external apparatus, comprising:
    a main body of a rectangular cover case, in which an opening is formed at a front and a fit opening is formed in a wall;
    a rectangular terminal enclosure supported inside said main body of the cover case, and having a terminal portion at a front for connection with the external terminals, and having a fit portion which is formed in a wall so as to be opposed to said fit opening when inserted into said main body of the cover case;
    a circuit board which is supported in said terminal enclosure and provided with connector terminals at a front;
    a semiconductor memory device which is mounted on said circuit board, sealed with resin and connected to said connector terminals; and
    a fitting member which is inserted into said fit opening of said main body of the cover case so as to be fitted to said fit opening, and to be fitted to said fit portion of said terminal enclosure to thereby fix said main body of the cover case and said terminal enclosure.

2. The portable storage device according to claim 1, wherein:
    said fit opening is formed in a top wall of said main body of the cover case, and said fit portion is formed in a top wall of said terminal enclosure; and
    said connector terminals are provided on a top surface of said circuit board.

3. The portable storage device according to claim 2, wherein said semiconductor memory device is mounted on an under surface of said circuit board.

4. The portable storage device according to claim 3, wherein said fitting member has a tapered projection at an end portion to be inserted into said fit opening.

5. The portable storage device according to claim 4, wherein said fit portion is a through hole passing through said terminal enclosure, said projection passing through said through hole when fitted.

6. The portable storage device according to claim 4, wherein said fit portion is formed in said terminal enclosure so as to have a recessed shape.

7. The portable storage device according to claim 1, wherein said terminal enclosure has support portions to support said circuit board with elastic force.

8. The portable storage device according to claim 1, wherein said fitting member has a tapered projection at the end portion to be inserted into said fit opening.

9. The portable storage device according to claim 8, wherein said fit portion is a through hole passing through said terminal enclosure, said projection passing through said through hole when fitted.

10. The portable storage device according to claim 1, wherein said fitting member is formed of a material which transmits output light from light emitting devices provided on said circuit board.

11. The portable storage device according to claim 10, wherein said light emitting device is LED.

12. The portable storage device according to claim 11, wherein said LED emits light by being supplied with power from said external apparatus.

13. The portable storage device according to claim 1, wherein electronic parts including at least any one of a capacitor, a resistor, a regulator and light emitting devices are mounted on a top surface of said circuit board.

14. The portable storage device according to claim 1, wherein said terminal enclosure is formed by integral molding.

15. The portable storage device according to claim 1, wherein said cover case is formed by integral molding.

* * * * *